United States Patent [19]

Rieder et al.

[11] Patent Number: 5,115,573
[45] Date of Patent: May 26, 1992

[54] INCREMENTAL LENGTH MEASURING SYSTEM

[75] Inventors: Heinz Rieder, Oberndorf; Max Schwaiger, Ostermiething, both of Austria

[73] Assignee: RSF-Elektronic Gesellschaft m.b.H., Tarsdorf, Austria

[21] Appl. No.: 766,813

[22] Filed: Sep. 26, 1991

[30] Foreign Application Priority Data

Oct. 11, 1990 [AT] Austria .................................. 2044/90

[51] Int. Cl.$^5$ ............................................. G01B 11/14
[52] U.S. Cl. ............................................. 33/706; 33/707; 250/237 G; 356/374
[58] Field of Search ............ 33/706, 707, 708; 356/395, 396, 373, 374, 375; 250/237 G

[56] References Cited

U.S. PATENT DOCUMENTS

| | | | |
|---|---|---|---|
| 4,101,764 | 7/1978 | Nelle | 250/237 G |
| 4,363,964 | 12/1982 | Schmitt | 33/707 |
| 4,459,750 | 7/1984 | Affa | 33/707 |
| 4,459,751 | 7/1984 | Nelle | 33/708 |
| 4,462,159 | 7/1984 | Nelle | 356/374 |
| 4,479,716 | 10/1984 | Nelle | 33/707 |
| 4,519,140 | 5/1985 | Schmitt | 33/706 |
| 4,631,404 | 12/1986 | Burkhardt et al. | 33/707 |
| 4,996,778 | 3/1991 | Rieder et al. | 33/707 |
| 4,999,623 | 3/1991 | Affa | 250/237 G |
| 5,010,655 | 4/1991 | Rieder et al. | 33/707 |

FOREIGN PATENT DOCUMENTS

| | | |
|---|---|---|
| 1814785 | 6/1970 | Fed. Rep. of Germany . |
| 2540412 | 3/1977 | Fed. Rep. of Germany . |

*Primary Examiner*—Thomas B. Will
*Attorney, Agent, or Firm*—Collard, Roe & Galgano

[57] ABSTRACT

An incremental length measuring system comprises a scale member, which is provided with a measuring scale, a scanning unit having scanning elements for scanning the scale and for generating measured-value signals in response to the scanning of the scale, and an analyzing unit for analyzing the measured-value signals. The scale member comprises a reference track, which is parallel to the measuring scale and provided with a plurality of selectable reference marks associated with respective reference points. The scanning unit comprises a plurality of scanning elements associated with respective ones of the reference marks. A selector switch is provided, which is movable in unison with the scanning unit and is operable by permanent magnet devices, which are associated with any of the reference marks when it has been selected and are contained in a protective housing that contains the scale member and the scanning unit. The selector switch is operable to permit a generation or delivery of a reference pulse in response to the scanning of a reference mark by the scanning unit only when the reference mark has been selected. To facilitate the selection of a desired reference mark, a permanent magnet which is mounted within the protective housing is permanently associated with each selectable reference mark and each of the permanent magnets is selectively movable between an inactive position and an active position, in which the permanent magnet is arranged to actuate the selector switch.

22 Claims, 4 Drawing Sheets

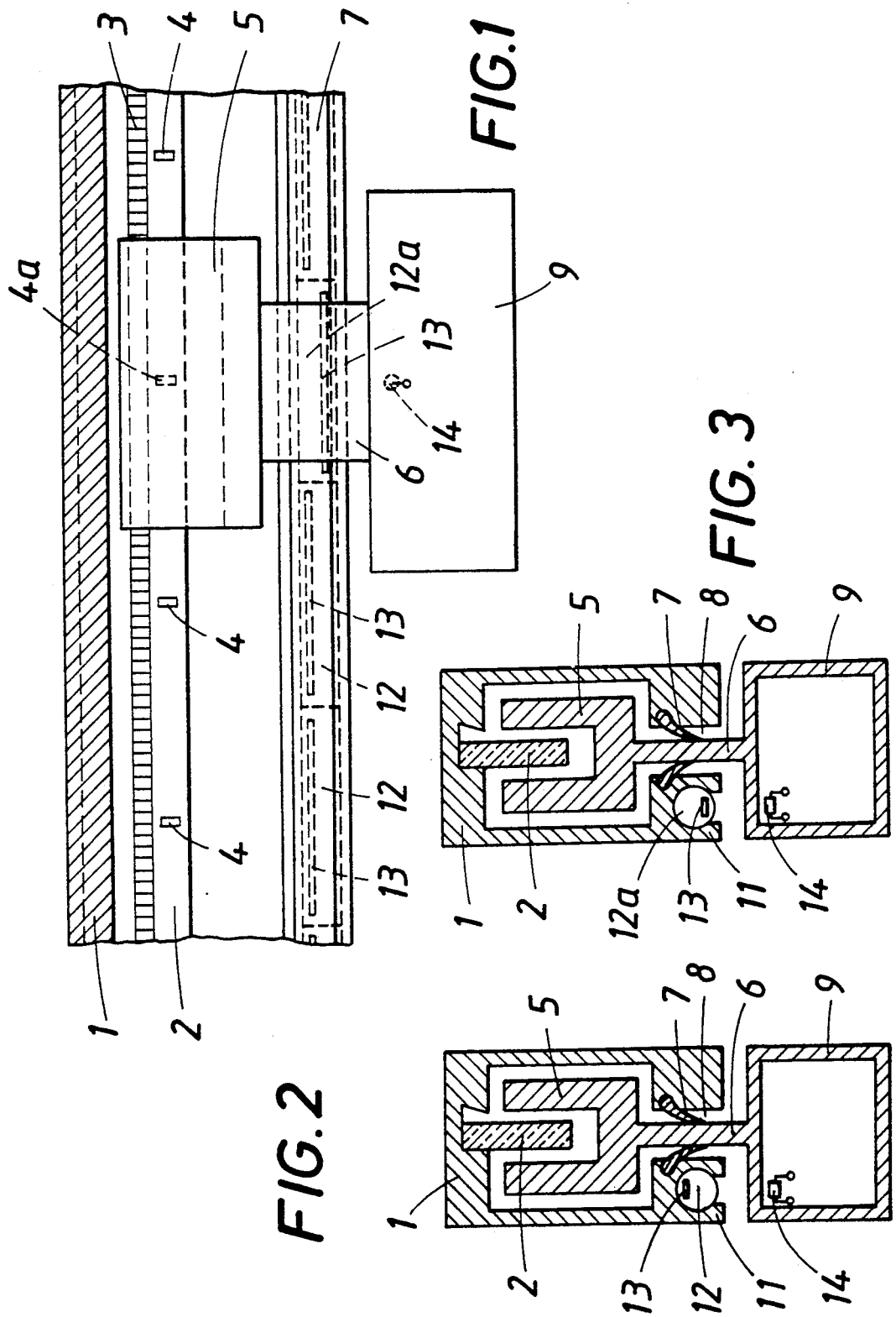

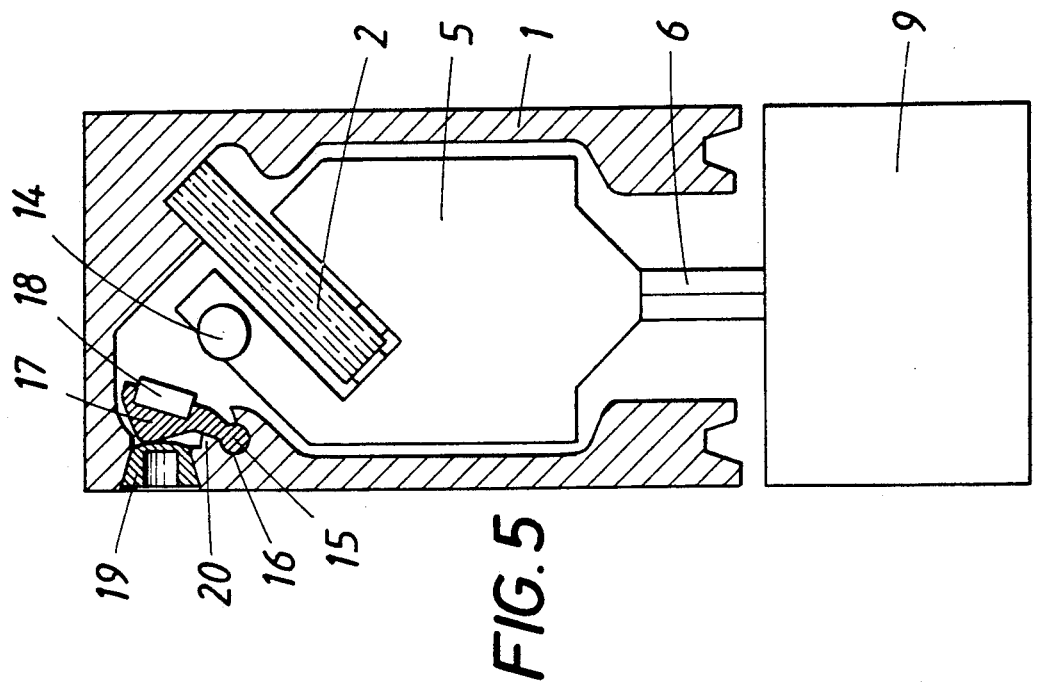
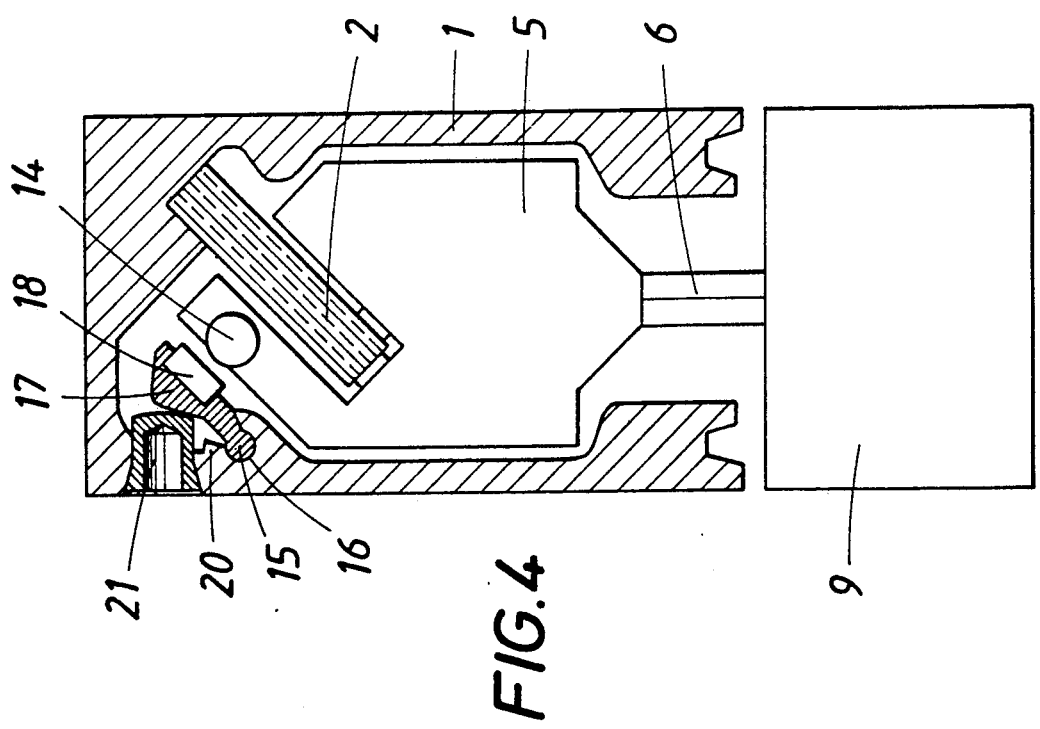

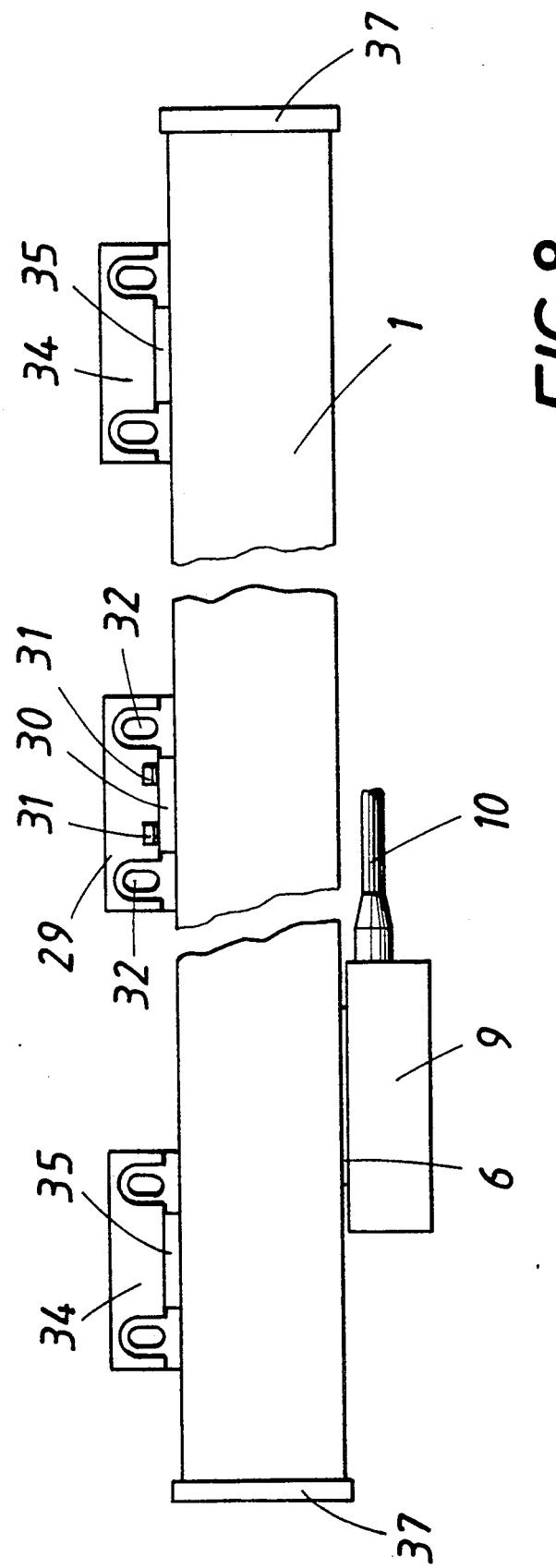

INCREMENTAL LENGTH MEASURING SYSTEM

BACKGROUND OF THE INVENTION

1. Field of the Invention

This invention relates to an incremental length measuring system comprising a scale member, which is provided with a measuring scale, a scanning unit having scanning element for scanning the scale and for generating measured-value signals in response to the scanning of the scale, and an analyzing unit for analyzing said measured-value signals, wherein said scale member comprises a reference track, which is parallel to the measuring scale and provided with a plurality of selectable reference marks associated with respective reference points, the scanning unit comprises a plurality of scanning elements associated with said reference marks, a selector switch is provided, which is movable in unison with the scanning unit and is operable by permanent magnet means, which are associated with any of the reference marks when it has been selected and are contained in a protective housing that contains the scale member and the scanning unit, and said selector switch is operable to permit a generation or delivery of a reference pulse in response to the scanning of a reference mark by said scanning unit only when said reference mark has been selected.

2. Description of the Prior Art

In such length measuring apparatuses it is possible to select a reference mark because this will permit a simpler manufacture of the measuring means and will permit a selection of a predetermined reference point without a need for an invasion into the housing in which the measuring means are encapsulated. Such reference point may correspond to the machine datum of a machine tool and in that case the measurements may be related to the machine datum. A selection of reference marks will make sense also in case of measurements which are to be related to such reference mark. Published German Application 18 14 785 discloses mechanical on-off switches, which in conjunction with the shifting of the scanning unit are actuated by means of stops and which activate the analyzing circuit only at preselected reference marks. German Patent Publication 25 40 412 discloses length measuring systems which are of the kind described first hereinbefore and comprise permanent magnets, which are adapted to be attached to the scale member at preselectable points and serve to actuate reed relays, which are integrated in the scanning unit. But the mounting of such permanent magnets on the scale member into the housing of an encapsulated length measuring apparatus requires an undesired invasion into the interior of the protective housing. In most cases the permanent magnet is clamped to the scale member so that the permanent magnet may be shifted or fall off during a prolonged operation. For this reason it has already been proposed to form the protective housing with a longitudinal bore, which is separate from the interior space in which the scale member and the scanning unit are accommodated, and to slidably insert the permanent magnet into that longitudinal bore from the end of the housing. The permanent magnet is held in position by spacers, which fill the bore as far as to both ends. In that case the assembling is expensive and the housing containing the scale member must be accessible at the ends to permit the permanent magnet and the spacers to be inserted into and pulled out of the bore.

For a higher accuracy of measurement it is desired that in case of a differential thermal expansion of the scale member, the protective housing and the structure on which the length measuring apparatus is mounted—that structure normally consists of the bed of a machine tool—the selected reference mark will not appreciably be shifted relative to the datum of the machine even in case of such differential thermal expansion. It has been attempted to fix the scale member in the housing only at the length center of the scale member and by means of an adhesive which has only a low elasticity and to yieldably mount the remaining portions of the scale member so that said portions can longitudinally shift relative to the protective housing. Besides, it is known to fix the protective housing to the carrying structure at the length center of the housing. In the previous practice the carrying structure was provided with rigid means for fixing the ends of the protective housing but linear elements which are capable of a linear adjustment, such as specially formed springs, hinges having crossing hinge axes, were provided between such fixing elements and the ends of the protective housing. Such a mounting is expensive and will not actually fulfill the desired purpose unless the rigid fixation of the protective housing and the fixation of the scale member to the protective housing are incidentally effected at the machine datum.

SUMMARY OF THE INVENTION

A first object of the invention is to provide a length measuring system which is of the kind mentioned first hereinbefore and in which any desired reference mark can be selected and the selection which has been effected can be changed and this can be accomplished with simple means and without a need for an invasion into the interior of the protective housing.

A second object of the invention is to provide such a length measuring system in which a longitudinal shifting of the scale member adjacent to the selected reference mark will be prevented even when the selected reference mark is not exactly at the length center of the scale member.

The first object set forth above is accomplished in that a permanent magnet which is mounted within the protective housing is permanently associated with each selectable reference mark and each of said permanent magnets is selectively movable between an inactive position and an active position, in which the permanent magnet is arranged to actuate the selector switch.

Simple means may be employed to move each permanent magnet between its inactive and active positions. Because a permanent magnet is associated with each selectable reference mark, there is no need for an alteration of or for prolonged mounting operations affecting the length measuring system.

According to a preferred feature each permanent magnet is mounted on a carrier, which is rotatably or pivotally mounted in the housing and which is operable to move the permanent magnet from an inactive position, in which the magnet faces away from the path of movement of the selector switch to an active position, in which the magnet actuates the switch as it moves past the permanent magnet.

According to a further feature of the invention the selector switch is mounted in an outer coupling member for coupling the switch to the scanning unit, the carriers for the permanent magnets are mounted in a recess, such as a laterally open bore or a groove, which is laterally spaced from said coupling member and extends along said scale member, and said permanent members are adjustable by means of said carriers from the outside of the housing. That embodiment affords the advantage that the scanning unit and the scale member may have the same design as the corresponding parts of length measuring systems which do not permit of a selection of reference marks and that, if the protective housing is provided with suitable means for receiving the permanent magnets and the coupling member is provided with means for receiving the switch it will be possible to subsequently provide an existing measuring apparatus with mark-selecting means.

According to another feature the selector switch is mounted on the scanning unit and disposed within the interior of the tubular protective housing and the permanent magnets are mounted in the protective housing by means of movably mounted carriers, which are operable from the outside by suitable means. In that case the permanent magnets may comprise edge portions, which are fitted into longitudinal grooves of hinged flaps, which are pivoted to the housing and pivotally movable by implements inserted through openings formed in the housing and adapted to be closed, and each of said flaps can be locked in either of the end positions of its pivotal movement. The housing consists in most cases of an extruded aluminum section.

A different embodiment permits permanent magnets to be used which are simple in design and can easily be mounted. In that embodiment each permanent magnet is mounted on a carrier, which consists of a profiled strip, which extends along the scale member at least throughout the range in which the selectable reference marks are mounted on the scale member and preferably extends throughout the length of the scale member, and which consists of a material which is elastic, preferably rubber-elastic, and has an edge portion, which extends as an interference fit in a groove formed in the inside surface of the tubular protective housing, and the permanent magnets associated with respective reference marks are carried by said strip at a distance from said edge portion and are normally in an inactive position. The housing is formed adjacent to each reference mark with an opening, which is adapted to be closed and through which screws or plugs can be inserted, which can be screwed or force-fitted into the strip and can be operated to bend to adjacent portion of the strip about the mounting edge portion so that the associated permanent magnet is moved to its active position. Alternatively it is possible to use an elastically deformable strip, which is held at both edges in grooves of the protective housing and which in an inactive position is concavely curved toward the interior of the housing and which adjacent to each magnet can be forced inwardly in the housing by means of a screw or plug which has been inserted through the opening and screwed or force-fitted into the strip and the strip can thus be caused to assume an inwardly convex curvature and thus to move the adjacent permanent magnet to its active position. In that case any portion of the strip which is in an inactive position will seal the housing at the adjacent opening for receiving a screw or plug.

The second object set forth hereinbefore is accomplished in that actuators and/or the carriers for the permanent magnets are provided and are so arranged that when a given magnet is in its active positions said actuators and/or carriers will fix and preferably clamp the scale member in position adjacent to the selected reference mark whereas the scale member is held elsewhere in a groove of the housing to be longitudinally adjustable for a compensation of differential thermal expansion of the housing, scale member and the structure which carriers the housing. In such an arrangement the protective housing may constitute a carrier and may be adapted to be immovably fixed to the carrying structure adjacent to the selected reference mark by means of one or more retaining elements so that the location of the selected reference mark registers with the location at which the protective housing is fixed and, as a result, normally registers also with the machine datum. In such an arrangement a disturbing influence of differential thermal expansion in a system comprising a simple housing and simple mounting means can be prevented in that the protective housing is not only immovably fixed adjacent to the selected reference mark but in addition is mounted by longitudinally yieldable retaining means, which are spaced from the length ends of the protective housing and have end portions, which extend through slots of the housing into and are longitudinally slidably fitted in longitudinal grooves or longitudinal bores, which are formed in the inside peripheral surface of an intermediate portion of the housing and serve to retain the carriers for the magnet. In an alternative embodiment, such an arrangement may be used even if the means for selecting the reference marks do not comprise permanent magnets but identical actuators for clamping the adjacent portions of the scale member in position. The scale member is usually not provided with selectable reference marks in its end portions so that there is adjacent to said end portions a free space for mounting the end portions of the retaining elements.

BRIEF DESCRIPTION OF THE DRAWING

FIG. 1 is a highly schematic sectional view showing a protective housing of a length measuring system and the scale member and scanning unit contained in said housing and the coupling member outside the housing.

FIGS. 2 and 3 are simplified transverse sectional views showing portions of the system of FIG. 1 adjacent to a permanent magnet, which is shown in active and inactive positions, respectively.

FIGS. 4 and 5 are transverse sectional views showing a modified measuring system, in which the permanent magnet contained in the interior of the housing is shown in active and inactive positions, respectively.

FIG. 8 is a schematic elevation showing the measuring apparatus of FIGS. 6 and 7.

DETAILED DESCRIPTION OF THE PREFERRED EMBODIMENTS

Figure 6:
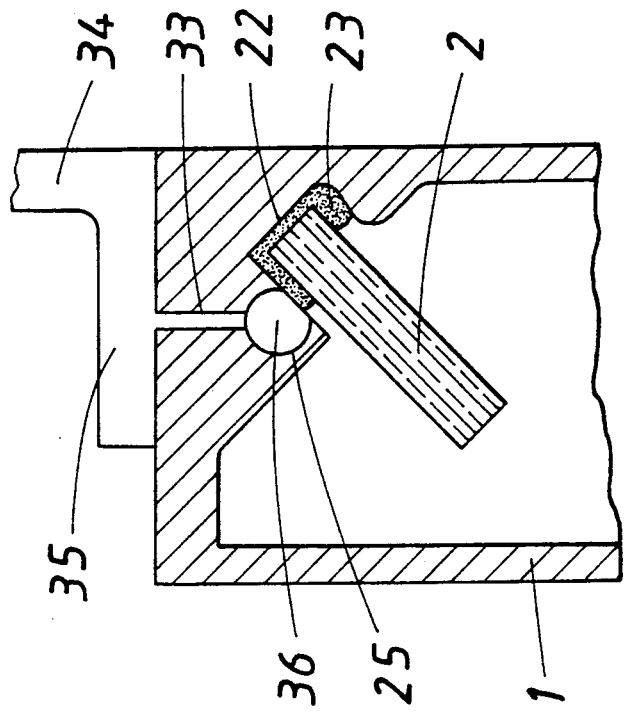
FIG. 6 is a further transverse sectional view showing a further modified measuring apparatus adjacent to an inactive permanent magnet.
Figure 7:
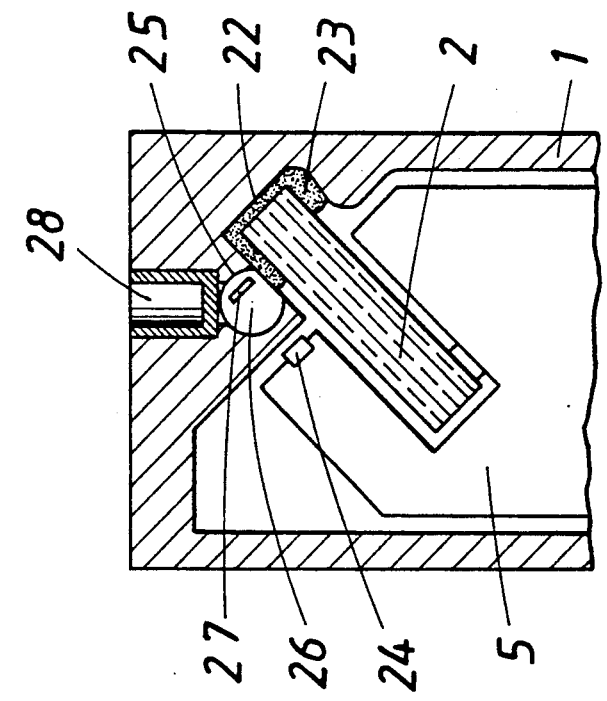
FIG. 7 is a trnasverse sectional view showing a portion of the measuring system of FIG. 6 adjacent to a retaining element, which is spaced from one length end of the housing.

Further details and advantages of the invention will become apparent from the following description of illustrative embodiments with reference to the drawing.

FIGS. 1 to 3 show a tubular protective housing or carrier 1, which contains a scale member 2, that is provided with a measuring scale 3 and carries reference marks 4 spaced apart along the scale member 2. The housing 1 also contains a scanning unit 5, which is movable along the scale member 2. Only the contour of said scanning unit 5 is shown. Said scanning unit 5 comprises illuminating and receiving means, which are known per se and serve to optoelectronically scan the scale 3 and the reference marks 4, 4a and in response to the scanning of the scale 3 generate measured-value signals, which can be converted to countable signals, and in response to the scanning of the reference marks 4 generate reference pulses. The scanning unit 5 is mounted on a swordlike carrier 6, which extends out of the housing 1 between sealing lips 7 through a slot 8 that is formed in the housing. Outside the housing 1 the carrier 6 is coupled to a coupling member 9, from which a cable 10 that is shown in FIG. 8 leads to an analyzing and/or display unit, not shown, for utilizing and/or displaying the result of the measurement. The length measuring system described thus far is basically known.

The housing 1 comprises on one side of the slot 5 an edge portion 11, which is formed with an open-bottomed undercut groove, which in cross-section has the shape of a part of a circle. That groove contains longitudinally extending carriers 12, which abut at adjacent ends and have radial bores and which by means of suitable implements, not shown, inserted into said bores can be moved from the inactive position that is shown in FIGS. 2 and 1 on the left and right of the scanning unit 5 to the active position shown at 12a in FIG. 1 adjacent to the scanning unit 5 and in FIG. 3. Each carrier 12 or 12a carries a permanent magnet 13, which only in an active position is adapted to actuate a relay or other selector switch 14, which is mounted on the coupling member 9. Each carrier 12 is associated with one of the reference marks 4, 4a so that a reference pulse which has been generated in response to the scanning of a reference mark 4a will be utilized in the measuring system only when the switch 14 has been actuated by the permanent magnet 13 which is associated with that reference mark.

In FIGS. 4 and 5, equivalent parts are designated with the same reference characters as in FIGS. 1 and 2. A difference from FIGS. 1 to 3 resides in that the selector switch 14 is included in the scanning unit 5. A flaplike carrier 17 is associated with each of the reference marks 4 on the scale member 2 and comprises an edge portion 15, which is held in a longitudinal groove 16 formed in the inside peripheral surface of the housing. Each carrier 17 carries a permanent magnet 18. Adjacent to each of the selectable reference marks and to the associated flap 17, the housing is formed with an opening, which is adapted to be closed by a plug 19. When the plug 19 has been removed, the flap 17 can be moved from the position shown in FIG. 5 to the position shown in FIG. 4 by means of a suitable implement, which is inserted through the opening. The edge 20 of said opening may permanently be deformed to hold the flap 17 in the position shown in FIG. 4. The flap 17 is also held in position by a larger plug 21. When a given permanent magnet 18 is in the active position shown in FIG. 4, it will actuate the switch 14 as the scanning unit 5 moves past such permanent magnet and when said switch 14 has been actuated the reference pulse generated in response to the scanning of the associated reference mark will be utilized.

In a modification of the design shown in FIGS. 4 and 5, the individual flaplike carries 17 may be replaced by a strip, which extends throughout the range of the selectable reference marks and has the same shape in cross-section as the flaps and to which the permanent magnets 18 associated with the reference marks are secured. In that embodiment a selected permanent magnet is adjusted in that the strip is bent inwardly by means of the plug 21.

In the embodiment shown in FIGS. 6 and 8 one longitudinal edge portion of the scale member extends into a longitudinal groove 22 formed in the inside peripheral surface of the protective housing 1 and is slidable to a limited extent along said groove. A resiliently yieldable retainer 23, which fills the groove 22 around the adjacent longitudinal edge of the scale member 2, is provided for that purpose. That retainer may consist of an elastomer, such as silicone rubber. Alternatively it is possible to provide spring elements, which have corrugations rising transversely or obliquely to the longitudinal direction.

The scanning unit 5 is again provided with a selector switch 24. The housing 1 is formed in its inside surface with a plurality of generally cylindrical carries 26, which are beveled on one side and are held in a longitudinal groove 25, which is formed in the inside peripheral surface of the housing 1 and has the shape of a segment of a circle in cross-section and is open to the groove 22. Each carrier 26 is associated with one of the selectable reference marks and carries a permanent magnet, which in FIG. 6 is shown in an inactive position. The housing 1 is formed in its top wall openings, which can be closed by plugs 28 and through which the carrier 26 can be rotated like the carriers 12 shown in FIGS. 2 and 3 to positions in which the associated permanent magnet 27 is in an active position for actuating the switch 24. The carrier 26 is initially in an inactive position, in which the flat surface is flush with the side face of the groove 22. As the carrier 26 is rotated, the curved surface of the carrier 26 enters the groove 22 from the side and thus constricts the groove 22 and compresses the retainer 23 so that the scale member 22 is fixed to the housing 1 adjacent to the selected reference mark 4. The openings which are closed by plugs 28 may consist of tapped openings so that a retainer 29 for retaining the protective housing 1 can be secured adjacent to the selected reference mark by means of screws, which extend through the edge portion 30 of the retaining element and are screwed into the openings from which the plugs 28 have been removed. The retainer 29 may be formed with slots 32 for receiving fixing screws for fixing the measuring apparatus to a machine.

Whereas the openings are tapped adjacent to an intermediate length portion of the scale member 2, two of said openings which are adjacent to each of the ends of the scale member 2 are interconnected by a longitudinal groove 33. Retainers 34 associated with the end portions of the housing 1 have a bottom flange 35 each, which carries lugs 36, which conform to the combined cross-sections of the slot 33 and the groove 25 and are longitudinally slidable therein and permit a longitudinal displacement of the housing 1 relative to the points at which said retainers are secured to the carrying structure. The housing 1 may be closed at its ends by end covers 37.

The invention is not restricted to the embodiments described hereinbefore by way of example but the scope of the invention may be described by broader language. It is apparent that the permanent magnets 13, 18 and 27, the selector switches 14 and 24, and the carries 12, 17, 26 constitute selecting means, which comprise selector switching means, which are operable to permit the delivery of a reference pulse to the analyzing means in response to the scanning of any of said reference marks 4, 4a only when said reference mark has been selected.

The selector switching means comprise a plurality of first coupling elements, which are constituted by the permanent magnets 13, 18, 27 and are fixed against a movement along the scale member 2 and associated with respective ones of said reference marks 4, 4a. Each of said first coupling elements is adapted to be selectively activated in that it is moved to an active position. The selector switch 14, 14a constitutes a second coupling element, which is coupled to the scanning unit 5 to move in unison therewith and is adapted so to cooperate with each of the permanent magnets 13, 18, 27 when it is activated that in conjunction with the scanning of a selected reference mark 4 or 4a by the scanning unit 5 the selector switch 14 is activated to permit the delivery of a reference pulse to the analyzing means in response to the scanning of the selected reference mark.

We claim:

1. In an incremental length measuring system comprising an elongate scale member provided with a measuring scale extending along said scale member and with a reference track, which extends along said scale and is provided with a plurality of longitudinally spaced apart reference marks defining respective reference points on said scale, a scanning unit, which is mounted to be movable along said scale member and comprises first scanning means for scanning said scale and for generating measured-value signals in response to the scanning of said scale and second scanning means, which are adapted to scan said reference track and to generate a reference pulse in response to the scanning of each of said reference marks, a protective housing, which contains said scale member and said scanning unit, analyzing means connected to receive said measured-value signals and said reference pulses from said scanning unit and adapted to derive data from said signals under the control of said reference pulses, and selecting means for arbitrarily selecting any of said reference marks and for permitting a delivery of a reference pulse to said analyzing means only in response to the scanning of a selected one of said reference marks by said second scanning means, which selecting means comprise a selector switch, which is arranged to move along said scale member in unison with said scanning unit along a predetermined path and is operable to permit the delivery of such a reference pulse to said analyzing means, and permanent magnet means, which are positioned in said housing in association with any selected one of said reference marks and arranged to operate said switch in conjunction with the scanning of said selected reference mark so as to permit the delivery of such reference pulse in response to such scanning, the improvement residing in that said permanent magnet means comprise a plurality of permanent magnets, each of which is associated with one of said reference marks and is mounted in said hosung to be individually movable from the outside of said housing between an inactive position, in which said permanent magnet is unable to operate said switch in conjunction with the scanning of the associated reference mark, and an active position, in which said permanent magnet is arranged to operate said switch in conjunction with the scanning of the associated reference mark.

2. The improvement set forth in claim 1, wherein said selecting means comprise actuating means, which are operable from the outside of said housing to move each of said permanent magnets between said inactive and active positions.

3. The improvement set forth in claim 1, wherein said switch is selectively operable by each of said magnets when in said active position to permit the generation of said reference pulses by said second scanning means.

4. The improvement set forth in claim 1, wherein said switch is selectively operable by each of said magnets when in said active position to permit the delivery of such reference pulses from said second scanning means to said analyzing means.

5. The improvement set forth in claim 1, wherein each of said permanent magnets is mounted on a carrier, which is mounted in said housing and angularly movable from the outside of said housing about an axis which is parallel to said predetermined path between a first position, in which said permanent magnet is in its inactive position and faces away from said path, and a second position, in which said permanent magnet is in its active position and faces said path.

6. The improvement set forth in claim 1, as applied to a length measuring system in which a coupling member disposed outside said housing on one side thereof is coupled to said scanning unit to move in unison therewith along said scale member, wherein said selector switch is mounted on said coupling member, and each of said permanent magnets is mounted in said housing to be accessible from the outside of said housing for a movement of said magnet between said inactive and active positions.

7. The improvement set forth in claim 6, wherein said housing is formed on that side on which said coupling member is disposed with a recess, which extends along said scale member and is open on the outside of said housing and each of said permanent magnets is mounted in said recess to be movable between said inactive and active positions.

8. The improvement set forth in claim 2, as applied to a length mesuring system in which said housing is tubular and defines an interior space, which contains said scale member and said scanning unit, wherein said switch is mounted on said scanning unit and disposed in said interior space and each of said permanent magnets is carried by carrying means, which are movably mounted in said housing and operable from the outside of said housing to move said permanent magnet between said inactive and active positions.

9. The improvement set forth in claim 8, wherein said housing has an inside peripheral surface defining said interior space and formed with groove means extending along said scale member, each of said carriers comprises a flap, which is pivoted in said groove means on an axis which is parallel to said scale member and means are provided for releasably locking each of said flaps in positions corresponding to said inactive and active positions of the associated permanent magnet.

10. The improvement set forth in claim 8, wherein said housing has an inside peripheral surface defining said interior space and formed with a groove extending along said scale member adjacent to said reference marks, said carrying means comprise a profiled strip of elastic material, which extends along said scale member adjacent to all of said reference marks and has an edge portion extending as an interference fit in said groove and adjacent to each of said reference marks carries the associated permanent magnet at a distance from said edge portion, said strip is arranged normally to assume a position in which each of said permament magnets is in said inactive position, said housing is formed adjacent to each of said reference marks with an access opening, which is adapted to be closed, and through which said strip is accessible adjacent to the adjacent reference marks from the outside of said housing by an implement for deflecting said strip adjacent to said reference mark about said edge portion to move the adjacent permanent magnet to said active position.

11. The improvement set forth in claim 10, wherein said strip extends throughout the length of said scale member.

12. The improvement set forth in claim 10, wherein said strip consists of rubber-elastic material.

13. The improvement set forth in claim 10, wherein each of said access openings is a hole for receiving such an implement.

14. The improvement set forth in claim 13, wherein each of said holes is adapted to receive such an implement consisting of a plug as an interference fit.

15. The improvement set forth in claim 13, wherein each of said holes is a tapped hole for threadedly engaging such an implement consisting of a screw.

16. The improvement set forth in claim 1, wherein said housing has an inside peripheral surface formed with a groove extending along said scale member, said scale member is mounted in said housing by means of retaining means, which extend in and are yieldable along said groove, and local retaining means are provided for holding each of said permanent magnets in said active position and for retaining said scale member adjacent to each of said permanent magnets against a longitudinal movement of said scale member when said permanent magnet is in said active position.

17. The improvement set forth in claim 16, wherein said local retaining means comprise means for clamping said scale member in position.

18. The improvement set forth in claim 1, as applied to a length measuring system in which said housing is adapted to be mounted on a carrying structure, wherein said housing is provided with retaining means for fixing said housing to said carrying structure against a movement of said housing relative to said carrying structure along said scale member adjacent to each of said reference marks.

19. The improvement set forth in claim 1, as applied to a length measuring system in which said housing is adapted to be mounted on a carrying structure, wherein each of said permanent magnets is mounted on a carrier, which is mounted in said housing and angularly movable from the outside of said housing about an axis which is parallel to said predetermined path between a first position, in which said permanent magnet is in its inactive position and faces away from said path, and a second position, in which said permanent magnet is in its active position and faces said path, said housing has end portions at opposite ends and an intermediate portion between said end portions and has an inside peripheral surface formed with a recess extending along said scale member and is formed in said intermediate portion adjacent to each of said permanent magnets with a slot, which is open to said recess and on the outside of said housing, each of said carriers is movably mounted in said recess, and said housing is provided in said intermediate portion with retaining means, which extend through said slots into said recess and are longitudinally slidable in said recess and adapted to fix said housing to said carrying structure.

20. The improvement set forth in claim 19, wherein means are provided for retaining said scale member in said housing against a longitudinal movement adjacent to each of said permanent magnets when it is in said active position.

21. The improvement set forth in claim 19, wherein means are provided for retaining said housing against a movement relative to said carrying structure along said scale adjacent to each of said permanent magnets when it is in said active position.

22. In an incremental length measuring system comprising an elongate scale member provided with a measuring scale extending along said scale member and with a reference track, which extends along said scale and is provided with a plurality of longitudinally spaced apart reference marks defining respective reference points on said scale, a scanning unit, which is mounted to be movable along said scale member and comprises first scanning means for scanning said scale and for generating measured-value signals in response to the scanning of said scale and second scanning means, which are adapted to scan said reference track and to generate a reference pulse in response to the scanning of each of said reference marks, a protective housing, which contains said scale member and said scanning unit, analyzing means connected to receive said measured-value signals and said reference pulses from said scanning unit and adapted to derive data from said signals under the control of said reference pulses, and selecting means for arbitrarily selecting any of said reference marks and for permitting a delivery of a reference pulse to said analyzing means only in response to the scanning of a selected one of said reference marks by said second scanning means, which selecting means comprise selector switching means, which are operable to permit the delivery of such a reference pulse to said analyzing means in response to the scanning of one of said reference marks only when said reference mark has been selected, the improvement residing in that a plurality of first coupling elements are provided, which are fixed against a movement along said scale member and associated with respective ones of said reference marks, each of said first coupling elements is adapted to be independently selectively activated, a second coupling element is provided, which is coupled to said scanning unit to move in unison therewith and is adapted so to cooperate with each of said first coupling elements when it is activated that in conjunction with the scanning of a selected reference mark by said scanning unit said selector switching means are activated to permit the delivery of such reference pulse to said analyzing means in response to the scanning of said selected reference mark.

* * * * *